United States Patent
Campbell et al.

(10) Patent No.: US 8,613,133 B2
(45) Date of Patent: Dec. 24, 2013

(54) DEVICE FOR USE IN PHOTOVOLTAIC MODULE MANUFACTURE

(75) Inventors: Steven Campbell, Holland, OH (US); Stephen Murphy, Perrysburg, OH (US); James Poddany, Northwood, OH (US); Thomas Truman, Toledo, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/093,982

(22) Filed: Apr. 26, 2011

(65) Prior Publication Data
US 2011/0197412 A1 Aug. 18, 2011

Related U.S. Application Data

(62) Division of application No. 12/860,094, filed on Aug. 20, 2010, now Pat. No. 7,951,641.

(60) Provisional application No. 61/236,621, filed on Aug. 25, 2009.

(51) Int. Cl.
*H01L 31/05* (2006.01)

(52) U.S. Cl.
USPC ............ 29/746; 29/743; 257/E31.124; 438/98

(58) Field of Classification Search
CPC ......... B23D 31/00; H01L 31/05; Y02E 10/50
USPC .............. 29/743, 760, 746; 242/527; 438/98; 257/E31.124
See application file for complete search history.

(56) References Cited

U.S. PATENT DOCUMENTS

| | | | |
|---|---|---|---|
| 3,412,636 A | 11/1968 | Seiff | |
| 3,814,343 A * | 6/1974 | Bennett et al. | 242/527 |
| 4,104,870 A | 8/1978 | Robbio | |
| 4,401,003 A | 8/1983 | Baldwin et al. | |
| D351,059 S * | 10/1994 | Kahlcke | D3/18 |
| 5,679,176 A | 10/1997 | Tsuzuki et al. | |
| 6,063,996 A | 5/2000 | Takada et al. | |
| 6,184,457 B1 | 2/2001 | Tsuzuki et al. | |
| 6,313,395 B1 | 11/2001 | Crane et al. | |

FOREIGN PATENT DOCUMENTS

JP 60154312 A * 8/1985

OTHER PUBLICATIONS

Machine Translation of JP60-154312A, obtained Mar. 29, 2013.*
JP60-154312A, full translation, Apr. 2013.*

* cited by examiner

*Primary Examiner* — Livius R Cazan
(74) *Attorney, Agent, or Firm* — Dickstein Shapiro LLP

(57) ABSTRACT

An improved lead foil formation operation procedure for photovoltaic module manufacture is disclosed. The procedure includes lifting a lead foil to form a loop, pulling the loop through a hole in a plate, cutting the loop to form two ends, separating the ends, and folding the ends onto the plate.

12 Claims, 4 Drawing Sheets

A-A

B-B

DEVICE FOR USE IN PHOTOVOLTAIC MODULE MANUFACTURE

CLAIM OF PRIORITY

This application is a divisional of U.S. application Ser. No. 12/860,094, filed Aug. 20, 2010, now U.S. Pat. No. 7,951,641 which claims priority to U.S. Provisional Patent Application No. 61/236,621, filed on Aug. 25, 2009, the disclosures of which are incorporated herein by reference in their entireties.

TECHNICAL FIELD

This invention relates to an improved lead foil operation procedure for photovoltaic module manufacture.

BACKGROUND

Lead foil and other conductive strips are widely used in electrically connecting photovoltaic module. In a photovoltaic modules manufacturing process, the lead foil operation procedure includes the steps of lifting, cutting, and folding the lead foil.

DETAILED DESCRIPTION

Figure 1:
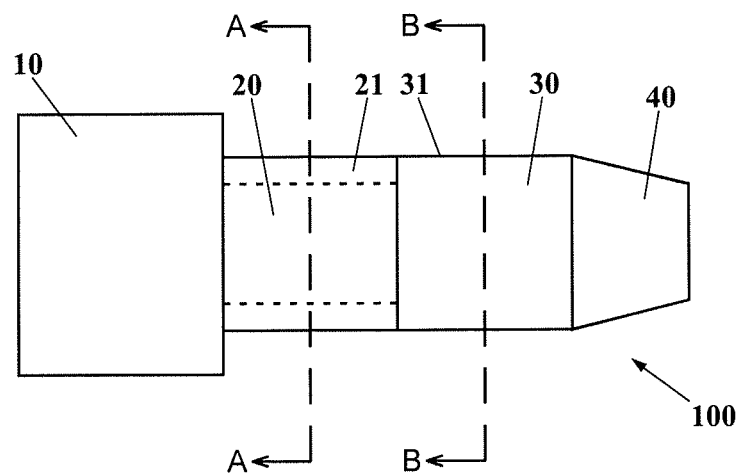
FIG. 1 is a side view of an embodiment of a mandrel for a lead foil operation procedure.

In a photovoltaic module manufacturing process, the lead foil operation procedure includes the steps of lifting, cutting, and folding the lead foil. To achieve higher efficiency, an improved lead foil operation procedure for photovoltaic module manufacture and related tool are developed.

In some embodiments, the improved photovoltaic lead foil manufacturing method can include the steps of positioning a lead foil adjacent to a photovoltaic module, wherein the lead foil forms a loop, positioning a cover plate adjacent to the photovoltaic module, wherein the cover plate has a hole, pulling the lead foil loop up and inserting a device into the foil loop, cutting the lead foil loop to form two ends, and separating the end portions of the lead foil loop and folding them down to the cover plate. The cover plate can include glass or any other suitable material. The lead foil loop can be pulled through the cover plate hole. A portion of the lead foil loop can be pulled through the cover plate hole by applying reduced pressure to a position on the lead foil loop, which can draw the portion of the lead foil loop through the hole. The reduced pressure can be applied by placing a vacuum source, such as a vacuum hose, adjacent to the position to be pulled.

After it is pulled through the cover plate hole, the lead foil loop can be gripped from each side of the loop by applying reduced pressure at two positions on the loop. For example, two sources, such as two vacuum hoses, can be placed at two positions on the loop to hold the loop positions a distance apart. This can allow the device to be inserted into the lead foil loop. The lead foil loop can be cut across the top of the loop with a shear mechanism such as a cutter, which can be any suitable cutter, including a physical blade, or any other cutting mechanism (such as a laser or a saw blade) at the step of cutting the lead foil loop to form two ends, wherein the cut-off portion of the loop is removed by a vacuum hose. Each end defines an end portion of the lead foil loop. Each end portion can be of substantially equal length. The step of cutting the lead foil loop can be performed at a fixed height to the cover plate. The end portions of the lead foil loop can be separated by vacuum sources used to hold two loop positions on the lead foil loop a distance apart. The improved lead foil manufacture process can further include the steps of inserting a roller between the end portions of the lead foil loop and folding the end portions of the lead foil loop to the cover plate by rolling them down.

The lead foil loop can be lifted by a low friction bearing part of a device, wherein the lead foil slides freely against the device, transferring the lift force to either side of the foil loop to create substantially equal length end portions of foil after the cut. After being lifted up, the lead foil loop can be positioned adjacent to a cut section of the device, which can be adjacent to the low-friction portion of the device. The cut section of the device can include a centering groove designed to accept a cutter so that the lift and cut steps are completed at the same conveyor station. After the foil loop is cut to form two end portions, the device can retract to allow the photovoltaic module to move on to the next step in the process. The device can include a mandrel. The device can include a lead angle portion including a lead angle, which can be adjacent to the cut section and can allow the device to be inserted into the foil loop. The device can include a metal. The low friction bearing part of the device can include a plastic or a low friction coating. The centering groove of the device can include a V-groove designed to accept a cutter.

In one aspect, a method of manufacturing a photovoltaic module can include positioning a lead foil adjacent to a photovoltaic module. The lead foil can include a loop between two ends of the photovoltaic module. The method can include, positioning a cover plate adjacent to the photovoltaic module, wherein the cover plate has a hole such that a portion of the lead foil loop is positioned through the hole. The method can include cutting the lead foil loop in half to form two ends, and separating the ends of the lead foil loop and positioning an end adjacent to the cover plate. The method can include inserting a device into the foil loop, for example, prior to or while cutting. The device can be a mandrel. The cover plate can include glass or any other suitable material.

In certain embodiments, the lead foil loop can be pulled through the cover plate hole. The lead foil loop can be pulled through the cover plate hole comprises applying reduced pressure to draw a portion of the loop through the hole. Cutting the lead foil loop to form two ends can include pinching the lead foil loop between a first position on the outside of a first side of the loop and a second position at an opposing point on a second side of the loop. Cutting the lead foil loop to form two ends can include positioning a portion of a cutting tool in the loop at a cutting position and cutting the loop at the cutting position. The loop can be cut at a first cutting position and a second cutting position. The lead foil loop can be gripped from each side of the loop with vacuum at the step of pulling the lead foil loop up and inserting a tool into the foil loop. The lead foil loop can be cut across the top of the loop with a cutting tool, for example, thereby cutting the lead foil loop in half, wherein the cut-off portion of the loop is removed by a vacuum hose. The step of cutting the lead foil loop in half can be performed at a fixed distance the cover plate. The method can include contacting with a vacuum source a remainder portion of the foil between the two cutting positions. Before cutting, reduced pressure can be applied at two positions on the lead foil loop to hold the two positions on the loop a distance apart. After cutting, the ends and/or end portions of the lead foil can be separated by applying reduced pressure to separate the ends and/or end portions of the lead foil.

The method can further include inserting a roller between the ends of the lead foil loop and folding an end of the lead foil loop to the cover plate by rolling it down. The roller can be positioned proximate to an end and/or end portion of the cut lead foil and can be moved along the lead foil end portion away from the cover plate hole toward the lead foil end, to fold the lead foil end and/or end portion so that it is adjacent to the cover plate.

The method can further include, prior to the step of cutting, positioning a low-friction portion of a device into a portion of the lead foil loop positioned through the cover plate hole. The device can be a mandrel. The low-friction portion can be a low-friction bearing part. The lead foil can slide freely against the mandrel. The method can include lifting the loop with the mandrel, and transferring the lift force to either side of the foil loop to create equal length portions (such as equal length end portions) of foil after the cut. After being lifted up, the lead foil loop can be positioned from the low-friction portion of the mandrel to a position adjacent to a cut section of the mandrel, wherein the cut section of the mandrel comprises a centering groove designed to accept a cutter so that the lift and cut steps are completed at the same conveyor station. The cut section can be coaxial and adjacent to the low-friction portion of the mandrel. After the foil loop is cut, the tool can retract to allow the photovoltaic module to move on to the next step in the process. The tool can include a lead angle portion, such as a lead angle tip, which can allow the device to be inserted into the foil loop. The lead angle portion can include a lead angle and can be adjacent and coaxial to the cut section. The tool can include a metal. The low friction bearing part of the tool can include a plastic or a low friction coating. The cut section of the tool can include a V-groove designed to accept a cutter.

In one aspect, a device for use in photovoltaic module manufacture can include a motion-transmitting portion, which can include an axis. The motion-transmitting portion can be configured to enable the device to be positioned with respect to a lead foil loop adjacent to a photovoltaic module. The motion-transmitting portion can be substantially cylindrical. The device can include a lead angle tip. The lead angle tip can be substantially conical and can include a conic section. The lead angle tip can include a lead angle configured to be directed through a lead foil loop. The lead angle tip can be coaxial to the axis of the motion-transmitting portion. The device can include a low-friction portion. The low-friction portion can be adjacent to the motion-transmitting portion. The low-friction portion can be substantially cylindrical. The low-friction portion can be coaxial to the motion-transmitting portion and the lead angle tip. The low-friction portion can be configured to lift and slide a lead foil loop against the device and transfer the lift force to either side of the foil loop. The device can include a cut section. The cut section can be adjacent to the low-friction portion. The cut section can be between the low-friction portion and the lead angle tip. The cut section can be substantially cylindrical. The cut section can be coaxial to the motion-transmitting portion, the lead angle tip, and the low-friction portion. The cut section can include a centering groove configured to accept a cutter, so that the lift and cut steps are completed at a same conveyor station.

The device can include a mandrel. The device can include metal. The low-friction portion can include a low-friction coating. The low-friction portion can include plastic. The centering groove can include a V-groove designed to accept a cutter.

Figure 1A:
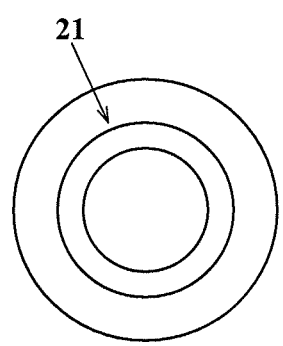
FIG. 1A is a cross-section view taken along line 1A-1A in FIG. 1.
Figure 1B:
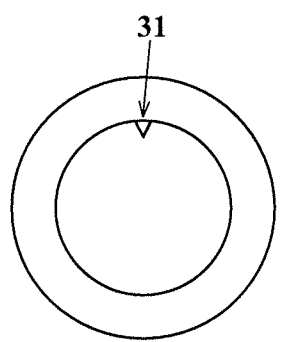
FIG. 1B is a cross-section view taken along line 1B-1B in FIG. 1.

In some embodiments, the tool can include a mandrel. Referring to FIG. 1, FIG. 1A, and FIG. 1B, mandrel 100 can include motion-transmitting member 10, low friction bearing part 20, and cut section 30. Motion-transmitting member 10 can be configured to enable the device to be positioned relative to a lead foil loop included in a photovoltaic module being manufactured. Motion-transmitting member 10 can be any suitable shape. For example, motion-transmitting member 10 can be substantially cylindrical. Motion-transmitting member 10 can include an axis to which low-friction portion 20, cut section 30, and lead angle tip 40 are coaxial. For example, the axis can be the line defined by the center point of the circular ends of motion-transmitting member 10, where motion-transmitting member 10 is substantially cylindrical.

Motion-transmitting member 10 can be positioned adjacent to low-friction portion 20, which can be a low-friction bearing portion configured to support a portion of a lead foil loop. Low-friction portion 20 can be substantially cylindrical. Low-friction portion 20 can be coaxial to the axis of motion-transmitting member 10. Low friction bearing part 20 can include low friction coating 21. Low friction coating 21 can include a polytetraflouroethylene (PTFE), such as TEFLON. Low friction coating 21 can also include other thermoplastic materials such as nylon or polyethylene high-density (PEHD) for low friction bearings. Low friction coating 21 can be formed on low friction bearing part 20 by vapor deposition or thermal spray. Low friction coating 21 can also include other suitable materials such as nylon or polyethylene high-density (PEHD) for low friction bearings.

In some embodiments, low friction coating 21 can include molybdenum disulfide ($MoS_2$). For $MoS_2$ low friction coating, the atomic interaction (Van der Waals) of the sulfide anions is weak, while covalent bonds within molybdenum are strong. Best performance from $MoS_2$ low friction coatings can be attained in the absence of water vapor, which are prone to surface adsorption. This makes $MoS_2$ low friction coating ideal for the process under vacuum. There can be a number of methods to apply MoS2 low friction coatings, including a simple rubbing or burnishing, air-spraying resin-bonded or inorganically bonded coatings, and by sputtering through physical vapor deposition (PVD). Thickness of low friction coating 21 can vary, depending on form of low friction coatings. For $MoS_2$ low friction coating, the typical thickness can be in the range of 5 to 1.5 micrometer. Sputtering techniques can produce thin films of 0.2 micrometer of $MoS_2$ low friction coating. Plasma sprays can result in $MoS_2$ low friction coating thicker than 0.003 inch or more. Moreover, friction with $MoS_2$ low friction coatings is independent of particle size. Low friction coating 21 can also include graphite or tungsten disulfide ($WS_2$).

The device can include cut section 30, which can be adjacent to low-friction portion 20 and coaxial to low-friction portion 20 and motion-transmitting portion 10. Cut section 30 can be substantially cylindrical. Cut section 30 can include a centering groove 31, which can be designed to accept a cutter and which can include a V-groove. Lead angle tip 40 can be adjacent to cut section 30 and can allow mandrel 100 to be inserted into foil loop (50 in FIG. 2). Lead angle tip 40 can be substantially conical. For example, lead angle tip 40 can include a conic section and can include a lead angle configured to be directed through a lead foil loop.

Figure 2:
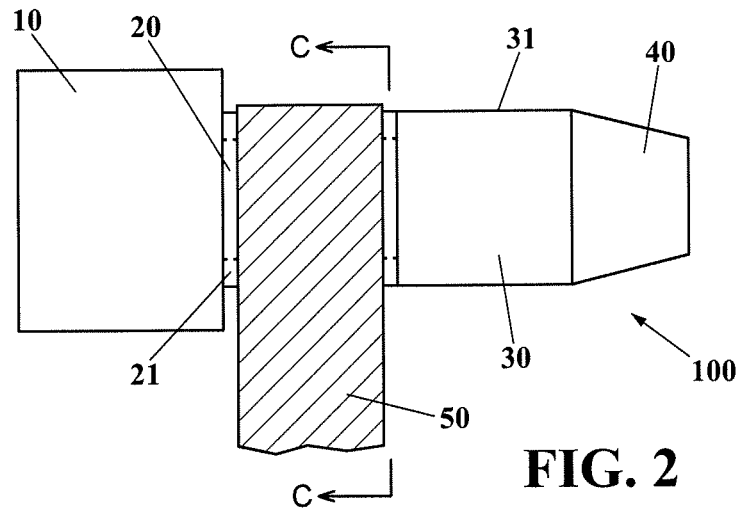
FIG. 2 is a side view of a mandrel with a lifted lead foil and a cover plate.
Figure 2A:
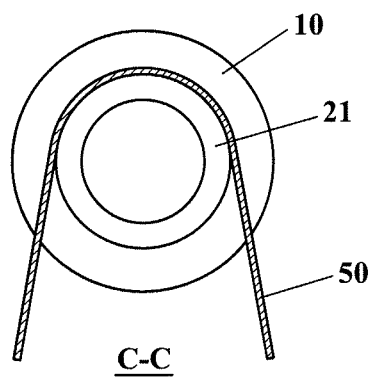
FIG. 2A is a cross-section view taken along line 2C-2C in FIG. 2.
Figure 3:
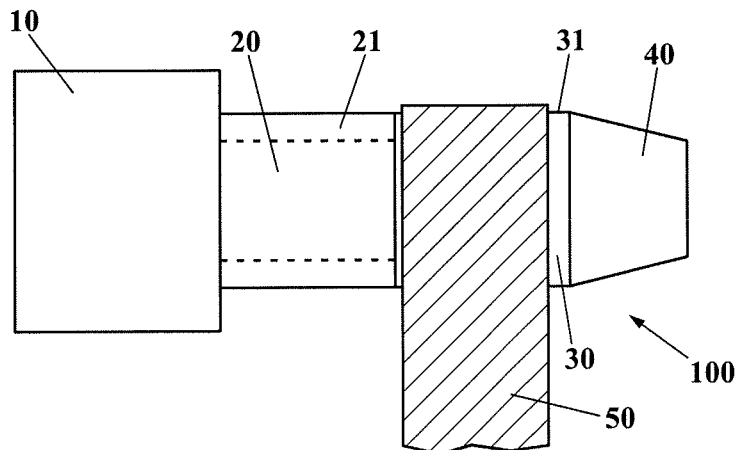
FIG. 3 is a side view of a mandrel with a lifted lead foil in a cut position.

Referring to FIG. 2, FIG. 2A, and FIG. 3, mandrel 100 can lift lead foil 50 up on low friction portion 20, wherein lead foil 50 can slide freely against mandrel 100, transferring the lift force to either side of foil loop 50 as necessary. As shown in FIGS. 2 and 2A, low-friction portion 20 can have a smaller cross-section than motion-transmitting portion 10 to allow motion-transmitting portion 10 to act as a stopper to prevent lead foil loop 50 from moving past low-friction portion 20. For example, as shown in FIG. 2A, low-friction portion 20 is a cylinder of a smaller diameter than the cylinder of motion-transmitting portion 10. When the lift function is completed, mandrel 100 can retract to position lead foil 50 to cut section 30, with centering groove 31 designed to accept a cutter. When lead foil loop 50 is positioned adjacent to centering groove 31 in cut section 30, a cutter can be directed through lead foil loop 50 toward centering groove 31 to cut lead foil loop 50 to form two end portions, each having an end. The improved lead foil operation procedure and related tool are developed that the lift and cut steps can be completed at the same conveyor station. Once the cut is complete, mandrel 100 can retract to allow the module to move on to the next step in the process. Mandrel 100 can retract along the shared axis of motion-transmitting member 10, low-friction portion 20, cut section 30, and lead angle tip 40.

Figure 4:
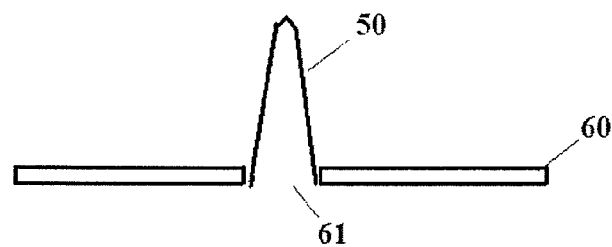
FIG. 4 is a side view of a lead foil loop.
Figure 5:
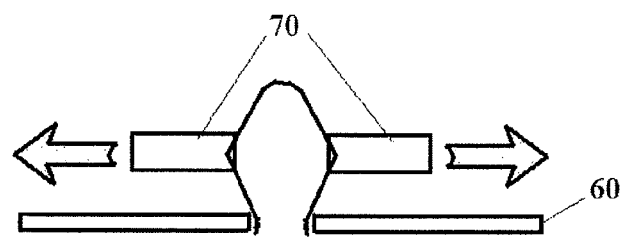
FIG. 5 is a side view illustrating a lead foil loop being gripped from each side with vacuum.

In some embodiments, the lead manufacture method can include applying reduced pressure to one or more portions of the lead foil. Referring to FIG. 4 through FIG. 7, lead foil loop 50 can be pulled through hole 61 of cover plate 60 of a photovoltaic module. As shown in FIG. 4, a portion of lead foil 50 can be pulled through hole 61 in cover plate 60. Lead foil 50 can be pulled by applying reduced pressure at a position on lead foil 50 desired to be pulled through hole 61. Reduced pressure can be applied by placing a vacuum source, such as a vacuum hose or a vacuum effector, adjacent to the portion of the lead foil 50 desired to be pulled.

Where a portion of lead foil loop 50 is positioned through hole 61, lead foil loop 50 can be opened by gripping from two positions on lead foil loop 50. The two positions can be gripped or held a distance apart to open loop 50 by applying reduced pressure at the positions. Reduced pressure can be applied by placing a vacuum source 70, such as a vacuum hose or vacuum effector, at each position.

A device such as a mandrel in combination with a cutter, or any other suitable device or system, can be used to make one or more cuts in lead foil loop 50 when it is opened after being pulled through hole 61. Reduced pressure source 80 (which can be a vacuum source such as a vacuum hose or a vacuum effector) can remove cut remainder portion 53 of lead foil loop 50, which can be formed when lead foil loop 50 is cut in two positions. The end portions, 51 and 52, of foil 50 can be separated by applying reduced pressure through vacuum end effectors 70. Any suitable positioning device, such as rollers 90 can be inserted between end portions 51 and 52. After that, vacuum can be removed to release end portions 51 and 52. Each of end portions 51 and 52 can be positioned adjacent to cover plate 60 by positioning roller 90 proximate to an end, and moving the roller along the end portion 51, 52 from cover plate hole 61, to the end of each end portion 51, 52. Thus, end portions 51 and 52 can be folded down to cover plate 60 by rollers 90. The cut step can be performed at fixed distance from cover plate 60. In some embodiments, the procedure can further include loop formation, which can be critical in order to create equal length legs of foil after the cut.

Figure 6:
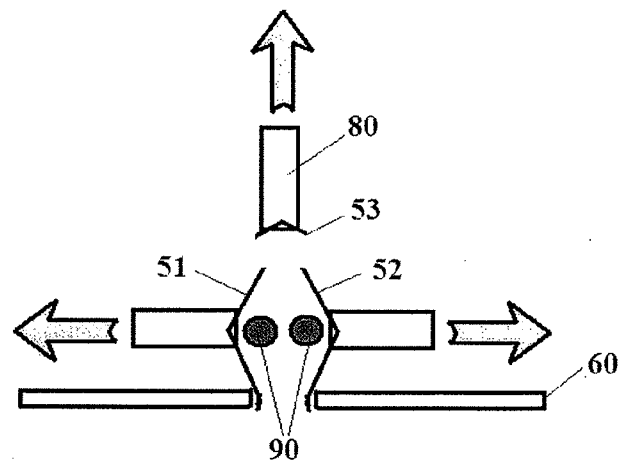
FIG. 6 is a side view illustrating a lead foil loop being gripped from each side with vacuum and cut in half across the loop top.
Figure 7:
FIG. 7 is a side view illustrating the halves of lead foil being folded down to the cover plate.
Figure 8:
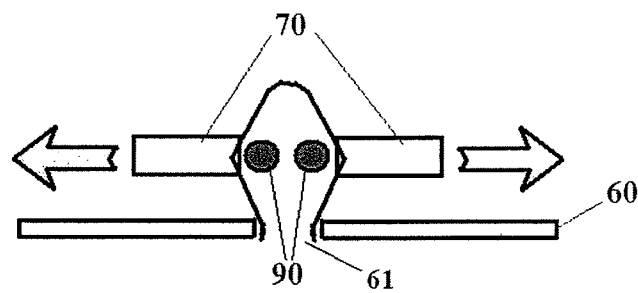
FIG. 8 is a side view illustrating a lead foil loop being gripped from each side with vacuum.
Figure 9:
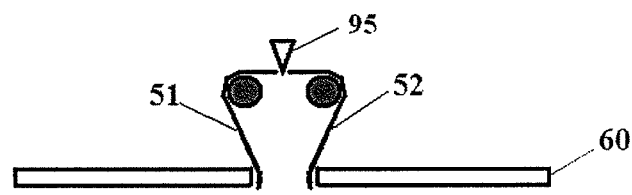
FIG. 9 is a side view illustrating a lead foil loop being gripped from each side with a roller and cut in half in the middle.
Figure 9A:
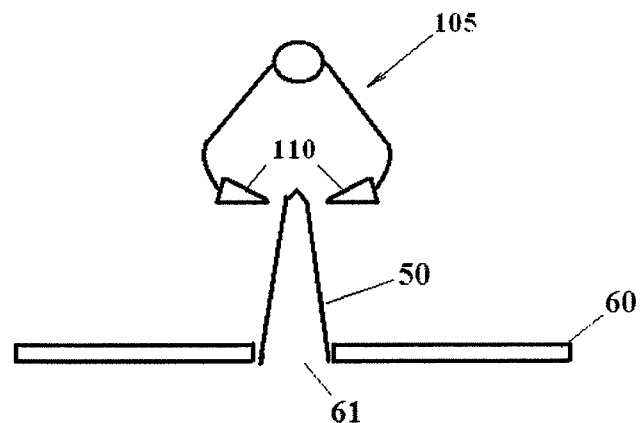
FIG. 9A is a side view illustrating a lead foil loop being cut by a cutter having two cutting surfaces.
Figure 10:
FIG. 10 is a side view illustrating the halves of lead foil being folded down to the cover plate.

In some embodiments, the procedure can include cutting the lead foil loop 50 in the middle. Mandrel 100 can be inserted in lead foil loop 50, as shown in FIG. 1 through FIG. 3, described above. Alternatively, referring to FIG. 8 through FIG. 10, after lead foil loop 50 is pulled through hole 61 of cover plate 60 of a photovoltaic module, lead foil loop 50 can be gripped from each side with vacuum end effector 70. Roller 90 can be inserted and positioned to support lead foil loop 50. Lead foil loop 50 can be cut in the middle with cutter 95, as shown in FIG. 9. In some embodiments, lead foil loop 50 can be cut by cutter 105 having two cutting surfaces 110, as shown in FIG. 9A. Cutting surfaces 110 can be blades. Cutting surfaces 110 can be positioned to form a pincher that can move together to pinch the outside surface of lead foil loop 50 and cut lead foil loop 50. This cutting can form two cuts in lead foil loop 50 in one cutting motion. The two cuts can be formed substantially simultaneously. The cutting motion of cutter 105 can form a remainder portion 53 of the lead foil as shown in FIG. 6. The remainder portion can be removed. Instead of two cutting surfaces 110, cutter 105 can include a single cutting surface 110 and a stopping surface which can cooperate with cutting surface 110 to pinch a portion of lead foil loop 50 from out outside. As cutting surface 110 moves toward the stopping surface, they pinch lead foil loop 50 and cutting surface cuts through both sides of lead foil loop 50. After lead foil loop 50 is cut, end portions 51 and 52 can be folded down to cover plate 60 by roller 90, as shown in FIG. 10.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A device for use in photovoltaic module manufacture comprising:
    a positioning portion configured to pull a lead foil loop upwardly through and over a hole in a cover plate located adjacent to a photovoltaic module;
    a cutter with at least one cutting surface configured to cut the lead foil loop to form two ends of the lead foil; and
    a separator configured to separate the two ends of the lead foil and fold at least one of the two ends into contact with an outer surface of the cover plate.

2. The device of claim 1, further comprising a mandrel configured to be positioned in the lead foil loop.

3. The device of claim 2, wherein the mandrel comprises a groove designed to accept the cutter.

4. The device of claim 1, wherein the positioning portion comprises a vacuum source located on a side of the cover plate, wherein the vacuum source is configured to pull the lead foil loop through the hole in the cover plate.

5. The device of claim 4, wherein the vacuum source is configured to separate a cut-off segment of the lead foil loop from the two ends of the lead foil after the lead foil loop is cut by the cutter.

6. The device of claim 4, further comprising:
a second vacuum source and a third vacuum source configured to separate a first and second side of the lead foil loop by applying a vacuum pressure to the first and second separate sides, respectively.

7. The device of claim 1, further comprising a first roller and a second roller, said first and second rollers configured to be positioned between the two ends of the lead foil.

8. The device of claim 1, wherein the cutter comprises a single cutting surface configured to cut the lead foil loop in the middle of the loop.

9. The device of claim 1, wherein the cutter comprises two cutting surfaces.

10. The device of claim 9, wherein the two cutting surfaces are designed to press against one another to cut the lead foil loop in two places substantially simultaneously.

11. The device of claim 1, wherein the cutter comprises a cutting surface and a stopping surface, wherein the cutting surface and the stopping surface are designed to press against one another to cut the lead foil loop in two places.

12. The device of claim 1, wherein the separator is located adjacent to the cover plate and movable away from the cover plate hole along an end of the lead foil to fold the end of the lead foil onto the cover plate.

* * * * *